United States Patent
Ruby et al.

(10) Patent No.: US 6,424,237 B1
(45) Date of Patent: Jul. 23, 2002

(54) BULK ACOUSTIC RESONATOR PERIMETER REFLECTION SYSTEM

(75) Inventors: Richard C. Ruby, Menlo Park; John D. Larson, III, Palo Alto; Paul D. Bradley, Mountian View, all of CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/746,525

(22) Filed: Dec. 21, 2000

(51) Int. Cl.$^7$ .............................. H03H 9/15; H03H 9/54; H03H 9/56; H03H 3/02
(52) U.S. Cl. .................... 333/187; 333/191; 310/324; 310/365; 310/349; 29/25.35
(58) Field of Search .............................. 333/186–192; 310/320, 324, 365, 349; 29/25.35

(56) References Cited

U.S. PATENT DOCUMENTS

| | | | |
|---|---|---|---|
| 4,556,812 A | * 12/1985 | Kline et al. ............. | 310/311 X |
| 5,075,641 A | * 12/1991 | Weber et al. ........... | 310/314 X |
| 5,153,476 A | 10/1992 | Kosinski .................. | 310/313 R |
| 5,166,646 A | 11/1992 | Avanic et al. .......... | 331/107 A |
| 5,233,259 A | 8/1993 | Krishnaswamy et al. ... | 310/324 |
| 5,446,306 A | 8/1995 | Stokes et al. ............... | 257/416 |
| 5,517,076 A | * 5/1996 | Takeuchi et al. ............ | 310/324 |
| 5,587,620 A | 12/1996 | Ruby et al. ................. | 310/346 |
| 5,692,279 A | * 12/1997 | Mang et al. ............ | 310/312 X |
| 5,696,423 A | * 12/1997 | Dydyk et al. ............ | 310/324 X |
| 5,714,917 A | 2/1998 | Ella ............................. | 332/114 |
| 5,780,713 A | 7/1998 | Ruby .......................... | 73/1.82 |
| 5,789,845 A | * 8/1998 | Wadaka et al. ......... | 310/311 X |
| 5,873,153 A | 2/1999 | Ruby et al. .................. | 29/25.35 |
| 5,883,575 A | 3/1999 | Ruby et al. ............... | 340/572.5 |
| 6,060,818 A | 5/2000 | Ruby et al. .................. | 310/363 |
| 6,150,703 A | * 11/2000 | Cushman et al. ....... | 333/187 X |
| 6,198,208 B1 | * 3/2001 | Yano et al. .................. | 310/358 |
| 6,215,375 B1 | * 4/2001 | Larson, III et al. ......... | 333/187 |

OTHER PUBLICATIONS

"Integrated Continuous–Time Filters: Principles, Design, and Applications", IEEE Press, A Selected Reprint Volume, IEEE Circuits and Systems Society, Sponsor, The Institute of Electrical and Electronics Engineers, Inc., Y.P. Tsividis, J.O. Voorman, Eds., New York, pp. 1, 3–12, 15–16, Jan. 1993.

* cited by examiner

*Primary Examiner*—Robert Pascal
*Assistant Examiner*—Barbara Summons

(57) ABSTRACT

A bulk acoustic resonator having a high quality factor is formed on a substrate having a depression formed in a top surface of the substrate. The resonator includes a first electrode, a piezoelectric material and a second electrode. The first electrode is disposed on the top surface of the substrate and extends beyond the edges of the depression by a first distance to define a first region therebetween. The piezoelectric material is disposed on the top surface of the substrate and over the first electrode, and the second electrode is disposed on the piezoelectric material. The second electrode includes a portion that is located above the depression. The portion of the second electrode that is located over the depression has at least one edge that is offset from a corresponding edge of the depression by a second distance to define a second region therebetween. The first and second regions have different impedances, as a result of the different materials located in the two regions. In addition, the first and second distances are approximately equal to a quarter-wavelength of a sound wave travelling laterally across the respective region, such that reflections off of the edges of the regions constructively interfere to maximize the reflectivity of the resonator.

20 Claims, 3 Drawing Sheets

BULK ACOUSTIC RESONATOR PERIMETER REFLECTION SYSTEM

FIELD OF THE INVENTION

The present invention relates to acoustic resonators, and more particularly, to acoustic resonators that may be used as filters for electronic circuits.

BACKGROUND

The need to reduce the cost and size of electronic equipment has lead to a continuing need for small filter elements. Consumer electronics such as cellular telephones and miniature radios place severe limitations on both the size and cost of the components contained therein. Many such devices utilize filters that must be tuned to precise frequencies. Accordingly, there has been a continuing effort to provide inexpensive, compact filter units.

One class of filter elements that has the potential for meeting these needs is constructed from acoustic resonators. These devices use bulk longitudinal acoustic waves in thin film piezoelectric material. In one simple configuration, a layer of piezoelectric material is sandwiched between two metal electrodes. The sandwich structure is suspended in air by supporting it around the perimeter. When an electric field is created between the two electrodes via an impressed voltage, the piezoelectric material converts some of the electrical energy into mechanical energy in the form of sound waves. The sound waves can propagate longitudinally in the same direction as the electric field and reflect off the electrode/air interface. In addition, the sound waves also propagate in a direction transverse to the electric field and reflect off the various discontinuities at the edges of the electrodes or the structure.

The device is a mechanical resonator which can be electronically coupled. Hence, the device can act as a filter. For a given phase velocity of sound in the material, the mechanical resonant frequency is that for which the half-wavelength of the sound wave propagating longitudinally in the device is equal to the total thickness of the device. Since the velocity of sound is four orders of magnitude smaller than the velocity of light, the resulting resonator can be quite compact. Resonators for applications in the GHz range may be constructed with physical dimensions less than 100 microns in diameter and a few microns in thickness.

Thin film bulk acoustic resonators (FBARs) and stacked thin film bulk wave acoustic resonators (SBARs) include a thin sputtered piezoelectric film having a thickness on the order of one to two microns. Electrodes on top and bottom sandwich the piezoelectric film to provide an electric field through the piezoelectric material. The piezoelectric film, in turn, converts a fraction of the electric field into a mechanical field. An FBAR is a single layer of piezoelectric material and acts as an absorption filter. An SBAR is constructed by stacking two or more layers of piezoelectric material with electrodes between the layers and on the top and bottom of the stack. SBARs are typically used as transmission filters.

To simplify the following discussion, the present invention will be explained in terms of an FBAR; however, it will be apparent from the discussion that the teachings of the present invention are also applicable to SBARs as well. The portion of the piezoelectric film included between the overlap of electrodes forms an acoustic cavity. The primary oscillatory mode of this cavity is that in which sound waves, of the compression, shear, or plate wave type, propagate in a longitudinal direction perpendicular to the plane of the electrodes. Unfortunately, there are other oscillatory modes that can be excited. These so-called "lateral mode" resonances correspond to sound waves travelling parallel to the plane of the electrodes and bouncing off of the walls of the acoustic cavity or the discontinuity at the edge of the electrode layers. Once in these lateral modes, the mechanical energy is lost as heat. This loss of energy affects the quality of the FBAR. Reducing the energy loss from lateral mode resonances will improve the quality factor (Q) of the FBAR and permit the design of sharper frequency response filters, duplexers and oscillators with lower phase noise.

It is an object of the present invention to provide an improved, high Q bulk acoustic resonator with reduced energy loss from lateral mode resonances.

SUMMARY

In accordance with one embodiment of the present invention, an acoustic resonator includes a substrate, first and second electrodes, and a piezoelectric material. The substrate has a depression formed in a top surface thereof. The first electrode, which is disposed over the depression in the top surface of the substrate, to provide an electrode/air interface, extends beyond the edges of the depression by a first distance to define a first region therebetween. The piezoelectric material is disposed on the top surface of the substrate and over the first electrode. The second electrode is disposed on the piezoelectric material and includes a portion that is located above the depression. The portion of the second electrode that is located above the depression has at least one edge that is offset from a corresponding edge of the depression by a second distance to define a second region therebetween. An overlap of the first and second electrodes and the piezoelectric material forms an acoustic cavity of the resonator. The first and second regions have impedances that differ from each other, as a result of the difference in materials in the two regions. In addition, each of the first and second distances is approximately equal to a quarter-wavelength of a sound wave travelling laterally across the respective region, such that reflections off of the edges of the regions constructively interfere to maximize the reflectivity of the resonator. Thus, the first and second regions act as Bragg reflectors and reflect sound waves from lateral mode resonances back to the acoustic cavity of the resonator, where these sound waves may then be converted to the desired, primary oscillatory mode.

The acoustic resonator includes a further perimeter reflection system to reflect additional sound waves from lateral mode resonances back to the acoustic cavity of the resonator. The perimeter reflection system can include structures disposed on the piezoelectric material around the first electrode or structures disposed on the piezoelectric material above the depression and around the second electrode. An example of the former includes a structure located a predetermined distance from an edge of the first electrode corresponding to an edge of the second electrode that is offset from a corresponding edge of the depression. A third region extends from that edge of the first electrode to the structure. The third region has an impedance that differs from that of the second region, and the predetermined distance is approximately equal to a quarter-wavelength of a sound wave travelling laterally across the third region. The structure itself defines a fourth region having an impedance different from that of the third region, and the width of the fourth region is approximately equal to a quarter-wavelength of a sound wave travelling laterally across the fourth region.

A example of the latter structure is one disposed on the piezoelectric material above the depression and located a predetermined distance from an edge of the second electrode that is offset from a corresponding edge of the depression. A third region extends from that edge of the second electrode to the structure, and the predetermined distance is approximately equal to a quarter-wavelength of a sound wave travelling laterally across the third region. Similar to the previous example, the structure itself defines a fourth region having an impedance different from that of the third region, and the width of the fourth region is approximately equal to a quarter-wavelength of a sound wave travelling laterally across the fourth region.

In accordance with another embodiment of the invention, a method of making an acoustic resonator is described. The method includes providing a substrate having a depression formed in a top surface thereof and a first electrode disposed on the top surface. The first electrode is located above the depression and extends beyond the edges of the depression by a first distance to define a first region therebetween. The method further includes depositing a piezoelectric material on the top surface of the substrate over the first electrode and depositing a second electrode on the piezoelectric material. An overlap of the first and second electrodes and the piezoelectric material forms an acoustic cavity of the resonator. The second electrode includes a portion located above the depression that has at least one edge that is offset from a corresponding edge of the depression by a second distance to define a second region therebetween. The second region has an impedance that differs from that of the first region. In addition, each of the first and second distances is approximately equal to a quarter-wavelength of a sound wave travelling laterally across the respective region, and the first and second regions form Bragg reflectors. Additional structures, such as those described above, can also be added to reflect more sound waves from lateral mode resonances back to the acoustic cavity of the resonator.

BRIEF DESCRIPTION OF THE DRAWINGS

The present invention may be better understood, and its numerous object, features, and advantages made apparent to those skilled in the art by referencing the accompanying drawings, wherein like reference numerals are used for like parts of the various drawings.

DETAILED DESCRIPTION

Figure 1:
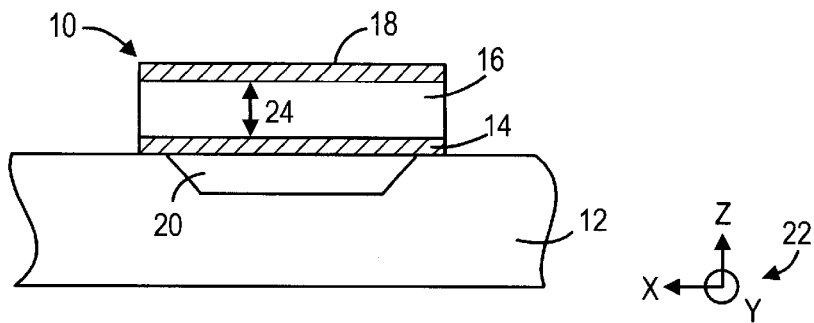
FIG. 1 is a cross-sectional view of an FBAR resonator.
Figure 2:
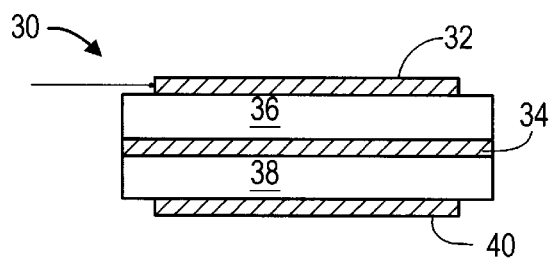
FIG. 2 is a cross-sectional view of an SBAR resonator.

The present invention may be more easily understood with reference to FIGS. 1 and 2, which are cross-sectional views of an FBAR and an SBAR, respectively. Referring to FIG. 1, an FBAR 10 formed on a substrate 12 includes bottom and top electrodes 14 and 18, respectively, which sandwich a sheet of piezoelectric material 16. The piezoelectric material 16 is suspended over a depression 20 to provide an electrode/air interface on the bottom of the FBAR. The depression 20 is typically created by etching away a portion of substrate 12. The preferred piezoelectric material is aluminum nitride, AlN, however other piezoelectric materials may also be used. The electrodes 14 and 18 are preferably made of molybdenum; however, embodiments employing other materials may also be constructed. A coordinate system 22 is oriented such that the z-axis corresponds to longitudinally directed waves of any mode type, while the x-axis and y-axis refer to transversely directed waves of the compression, shear or plate-mode type.

These devices are designed to use bulk compression or shear acoustic waves propagating in a direction parallel to the z-axis in the thin film piezoelectric material as the desired resonator mode. When an electric field is created between the two electrodes via an impressed voltage, the piezoelectric material converts some of the electrical energy into mechanical energy in the form of sound waves. The sound waves propagate in the same direction as the electric field shown at 24 and reflect off of the electrode/air interface.

At the mechanical resonance, the device appears to be an electronic resonator; hence the device can act as a notch filter. The mechanical resonant frequency is the frequency for which the half-wavelength of the sound waves travelling in the device is equal to the total thickness of the device for a given composite phase velocity of sound in the material. Since the velocity of sound is four orders of magnitude smaller than the velocity of light, the resulting resonator can be quite compact. Resonators for applications in the GHz range may be constructed with physical dimensions of the order of 100 microns in length and a few microns in thickness.

FIG. 2 is a cross-sectional view of an SBAR 30. An SBAR provides electrical functions analogous to those of a bandpass filter. The SBAR 30 is basically two FBAR filters that are mechanically coupled. The depression under the bottom layer of piezoelectric material has been omitted from this drawing. A signal across electrodes 32 and 34 at the resonance frequency of the piezoelectric layer 36 will transmit acoustic energy to the piezoelectric layer 38. The mechanical oscillations in the piezoelectric layer 38 are converted to an electrical signal across electrodes 34 and 40 by the piezoelectric material.

Referring again to FIG. 1, when a potential is applied across the electrodes in the z direction to generate the desired wave type, a transversely directed mechanical strain may be generated, which can excite sound waves travelling laterally within the piezoelectric layer. These sound waves are predominately reflected by the abrupt change in density at the edges of the electrodes shown at 24, but may also be reflected by the edges of the depression or the edges of the piezoelectric sheet. A portion of the sound waves is not reflected by the edges but instead passes across the edge and is lost as heat. It is this loss of energy due to these lateral modes that reduces the quality factor (Q) of the FBAR.

Figure 3:
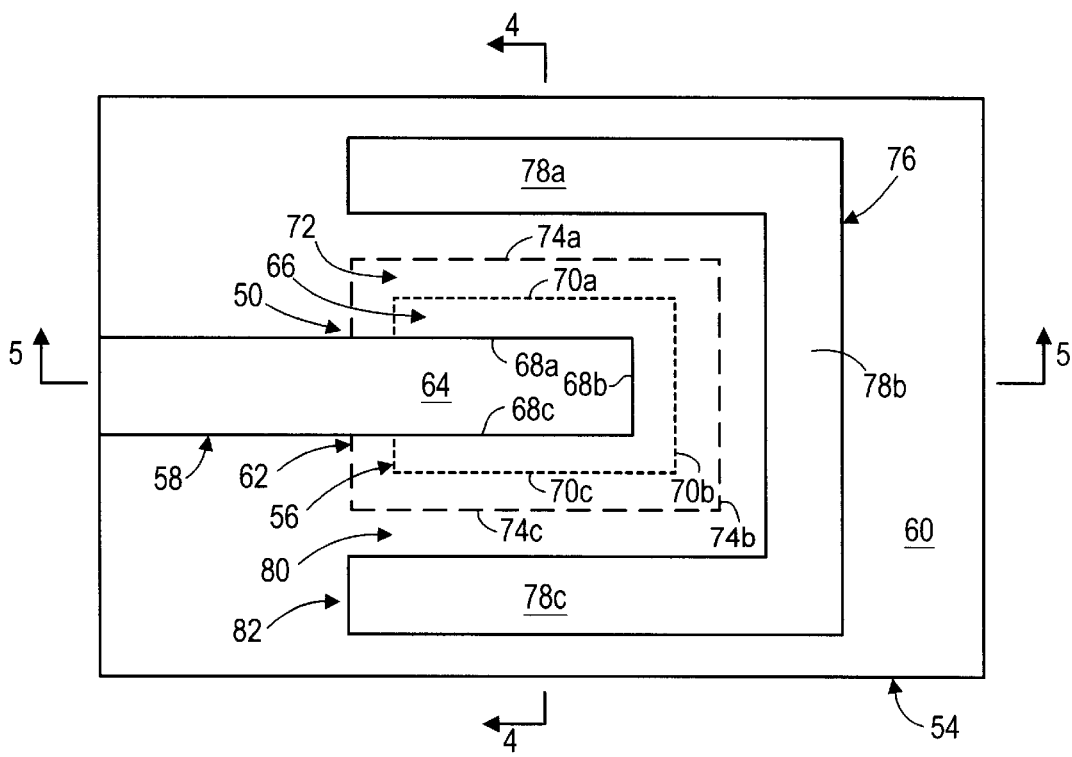
FIG. 3 is a top view of an FBAR in accordance with one embodiment of the present invention.
Figure 4:
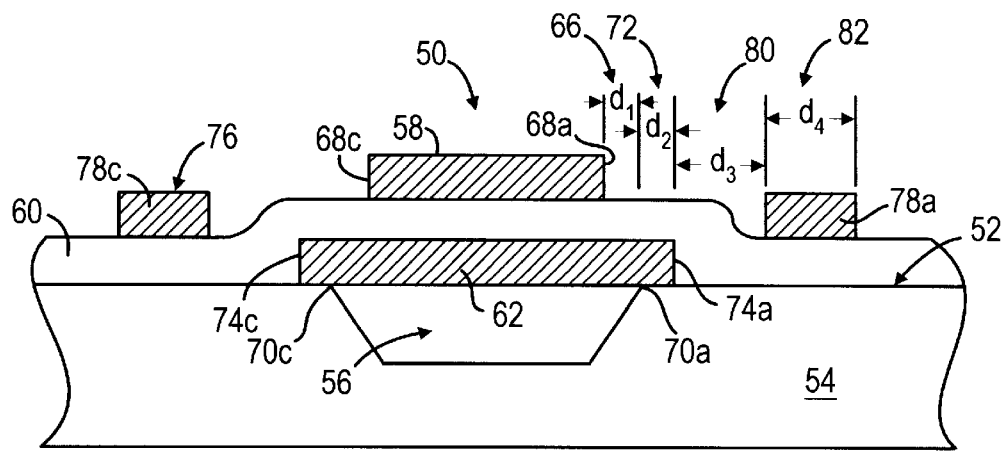
FIG. 4 is a cross-sectional view taken generally along the line 4—4 of FIG. 3.
Figure 5:
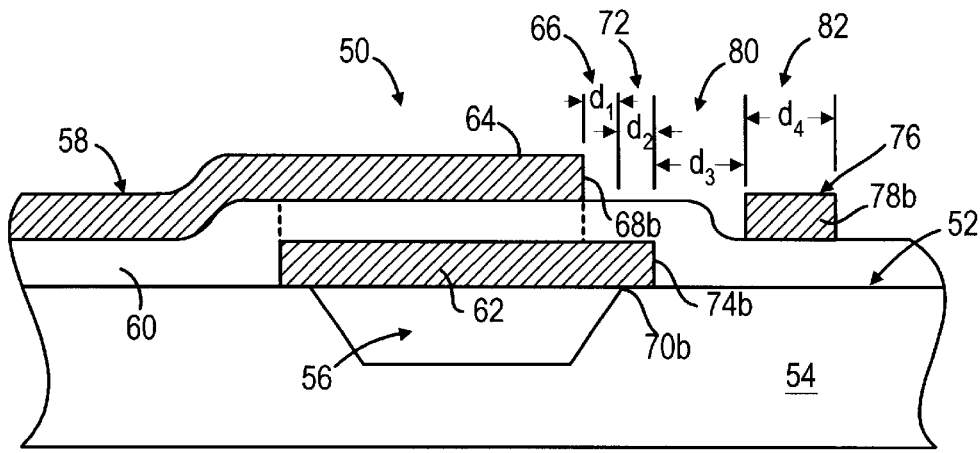
FIG. 5 is a cross-sectional view taken generally along the line 5—5 of FIG. 3.

FIGS. 3–5 illustrate an embodiment of an FBAR 50 in accordance with one embodiment of the present invention. FIG. 3 is a top view of the FBAR, and FIGS. 4 and 5 are cross-sectional views taken generally along lines 4—4 and 5—5, respectively. The FBAR 50 is formed on a top surface 52 (FIGS. 4 and 5) of a substrate 54 and is situated above a depression 56 in the substrate 54 to provide an electrode/air interface for the bottom of the FBAR. The FBAR 50 includes a top electrode layer 58, a layer of piezoelectric material 60 and a bottom electrode layer 62. In FIG. 3, the bottom electrode layer 62 and the depression 56 are indicated by dashed lines, as both are located underneath the layer of piezoelectric material 60. The top electrode layer 58 includes a portion 64 that extends over the depression 56 in the top surface 52 of the substrate 54. An overlap of the portion 64 of the top electrode layer 58, the piezoelectric material 60 and the bottom electrode layer 62 defines the acoustic cavity of the FBAR.

The FBAR 50 of the present invention is an improved FBAR with a higher Q than conventional FBARs. This is due to a perimeter reflection system surrounding the FBAR that reduces the loss of energy from the FBAR. The perimeter reflection system includes a plurality of regions that act as Bragg reflectors to recycle energy from lateral mode resonances and return that energy to the acoustic cavity so that it may be converted back to the primary oscillatory mode of the FBAR.

The perimeter reflection system includes a first region 66 that extends from edges 68a, 68b and 68c of the portion 64 of the top electrode layer 58 to corresponding edges 70a, 70b and 70c of the depression 56 and a second region 72 that extends from edges 70a, 70b and 70c of the depression 56 to corresponding edges 74a, 74b and 74c of the bottom electrode layer 62. As best illustrated in FIGS. 4 and 5, the first region 66 includes the layer of piezoelectric material 60 and a portion of the bottom electrode 62 that is located over the depression 56. The second region 72 includes the layer of piezoelectric material 60, the bottom electrode 62, and the substrate 54. As a result of the different materials which comprise the first and second regions, the first region has an impedance that differs from that of the second region. The impedance of the first region also differs from that of the acoustic cavity of the FBAR, as the first region does not include the top electrode 58.

The first region 66 has a width or distance $d_1$ that is equal to the distance from an edge 68a, 68b or 68c of the top electrode 58 to the corresponding edge 70a, 70b or 70c of the depression 56. Similarly, the second region 72 has a width or distance $d_2$ which is the distance between an edge 70a, 70b or 70c of the depression 56 and the corresponding edge 74a, 74b or 74c of the bottom electrode 62. Each distance $d_1$ and $d_2$ is approximately equal to a quarter-wavelength of a sound wave travelling laterally across the respective region. In the preferred embodiment of the invention the distance $d_1$ is greater than the distance $d_2$, and the distance $d_2$ is approximately 2 microns. Because of the mismatch of impedances between the acoustic cavity of the FBAR and the first region and between the first and second regions, a percentage of the sound waves from lateral mode resonances are reflected back to the acoustic cavity of the FBAR 50. Thus, the arrangement of the first and second regions 66 and 72 enables the FBAR 50 to suppress lateral mode resonances.

The perimeter reflection system further includes a structure 76 disposed proximate the BAR 50. In the preferred embodiment of the invention, the structure 76 includes a plurality of egments 78a, 78b and 78c and surrounds all but one side of the FBAR 50. However, one of rdinary skill in the art will appreciate that the structure 76 may include fewer segments. In addition, the segments need not be connected to one another. Each segment 76a, 76b and 76c is offset from the corresponding edge 74a, 74b and 74c of the first electrode by a distance $d_3$. Thus, a third region 80 having a width equal to the distance $d_3$ is formed between the edges 74a, 74b and 74c of the bottom electrode and the structure 76. The third region 80 has an impedance that differs from that of the second region 72. This difference in impedance is due to the absence of the bottom electrode layer 62 in the third region 80. Thus, the third region 80 includes only the layer of piezoelectric material 60 and the substrate 54. The distance $d_3$ of the third region 80 is selected such that it is approximately equal to a quarter-wavelength of a sound wave travelling laterally across the third region 80, so that reflections off of the edges of the third region will constructively interfere.

The structure 76 is preferably made of the same material as the top and bottom electrodes 58 and 62, respectively, and may be deposited on the layer of piezoelectric material 60 at the same time as the top electrode 58. The structure 76 has a width $d_4$. A fourth region 82 having the width $d_4$ includes the structure 76, the piezoelectric layer 60 and the substrate 54. The fourth region 82 has an impedance that differs from the impedance of the third region 80. The width $d_4$ of the fourth region 82 is selected such that it is approximately equal to a quarter-wavelength of a sound wave travelling laterally across the fourth region 82, so that reflections off of the edges of the fourth region 82 will constructively interfere.

Thus, in the perimeter reflection system of the present invention the distances $d_1$, $d_2$, $d_3$ and $d_4$ of the respective first region 66, second region 72, third region 80 and fourth region 82, are carefully selected such that for lateral mode resonances of the FBAR 50, sound waves reflecting off of the edges of each region constructively interfere to maximize the reflection coefficient of the FBAR 50. As a result, the regions act as Bragg reflectors, and energy from lateral mode resonances, which would have been lost, is reflected back to the acoustic cavity of the FBAR 50. Once reflected back to the acoustic cavity, this energy may be converted to the desired primary oscillatory mode of the FBAR, which is in a longitudinal direction perpendicular to the plane of the electrodes.

Although it is not illustrated in the drawings, one of ordinary skill in the art will appreciate that additional structures similar to structure 76 may be added at intervals around structure 76 to increase the percentage of energy from lateral mode resonances that is brought back to the acoustic cavity of the FBAR. The more Bragg reflector regions there are in the perimeter reflection system, the closer the perimeter reflection system will be to a perfect mirror that reflects all of the energy back to the acoustic cavity of the FBAR.

The FBAR 50 with the perimeter reflection system may be constructed, as follows, on the substrate, which can be, for example, a conventional silicon wafer, on which FBARs are manufactured simultaneously. For purposes of simplicity, however, the discussion will be limited to the manufacture of a single FBAR. The depression 56 is first etched into the top surface 52 of the substrate 54. Next a thin layer of thermal oxide is grown on the top surface 52 to prevent phosphorous from the phosphor-silica-glass (PSG), which will be used in a subsequent step, from diffusing into the substrate 54. Such a diffusion would convert the silicon forming substrate into a conductor, which would interfere with the electrical operation of the final device.

A sacrificial PSG layer (not shown) is then deposited on the top surface 52 at a temperature of approximately 450° C., using silicane and $P_2O_5$ to form a soft, glass-like material which is approximately 8% phosphorous. The PSG layer is then polished using a slurry to remove the portions of the PSG outside of the depression 56 and to leave a "mirror-like" finish on top of the PSG portion in the depression 56. The substrate is then cleaned.

After cleaning an electrode layer is deposited and selectively etched to form the bottom electrode 62 of the FBAR 50. Various materials, such as molybdenum, aluminum, tungsten, gold, platinum and titanium, may be used for electrodes. Molybdenum has a low thermoelastic loss, making it advantageous for use in resonators.

After the bottom electrode 62 has been deposited, the layer of piezoelectric material 60 is deposited. In one embodiment the piezoelectric layer is a sputter-deposited layer of AlN having a thickness in the range of approximately 0.1 micron and 10 microns. The top electrode layer 58 and the structure 76, which are formed of the same material as the bottom electrode 62, are then deposited on the layer of piezoelectric material 60 and selectively etched.

Next, the bottom side of the substrate may be thinned using a lapping, plasma etch, or chemical mechanical polishing (CMP) process to remove material from the underside of the substrate, thereby improving thermal properties of and reducing an electromagnetic influence in a resulting filter. The sacrificial PSG layer and thermal oxide layer may be removed from the depression 56 at any time after the bottom electrode 62 has been deposited. In the preferred embodiment of the invention, the PSG layer and thermal oxide layer are removed after the substrate has been thinned. Vias (not shown) are formed in the substrate to expose the PSG layer, and the PSG layer and thermal oxide layer are removed by etching in a dilute $H_2O$:HF solution. The resulting FBAR is illustrated in FIGS. 3–5.

Figure 6:
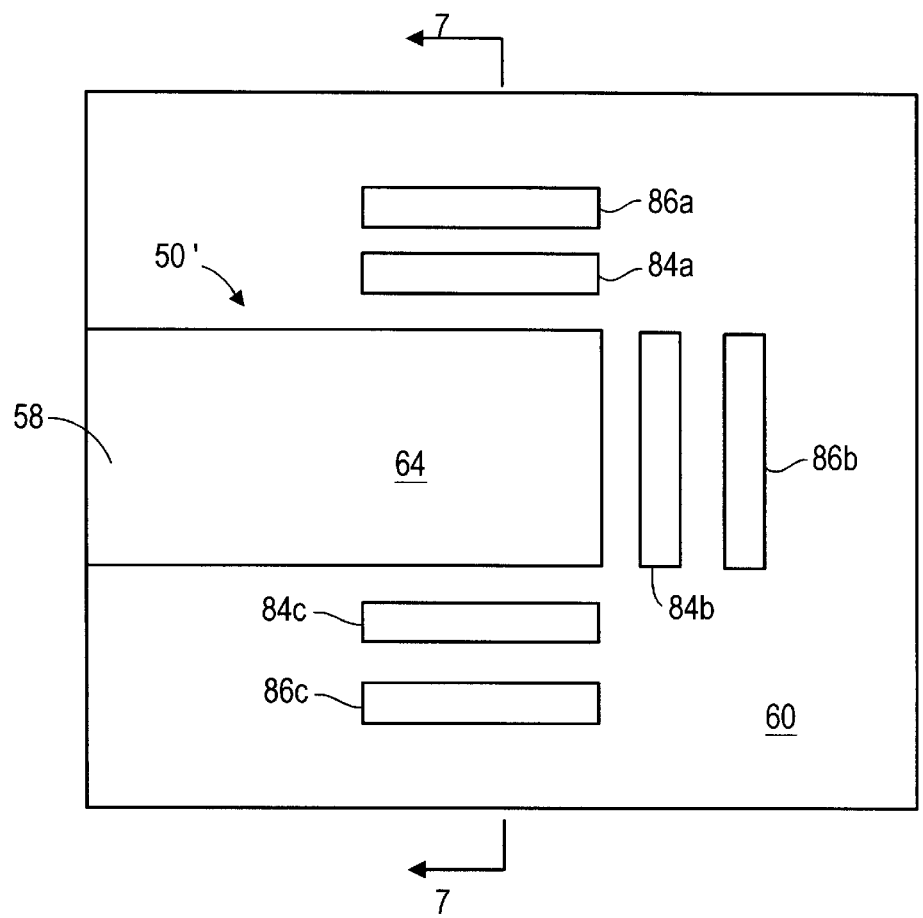
FIG. 6 is a top view of an FBAR in accordance with another embodiment of the present invention.
Figure 7:
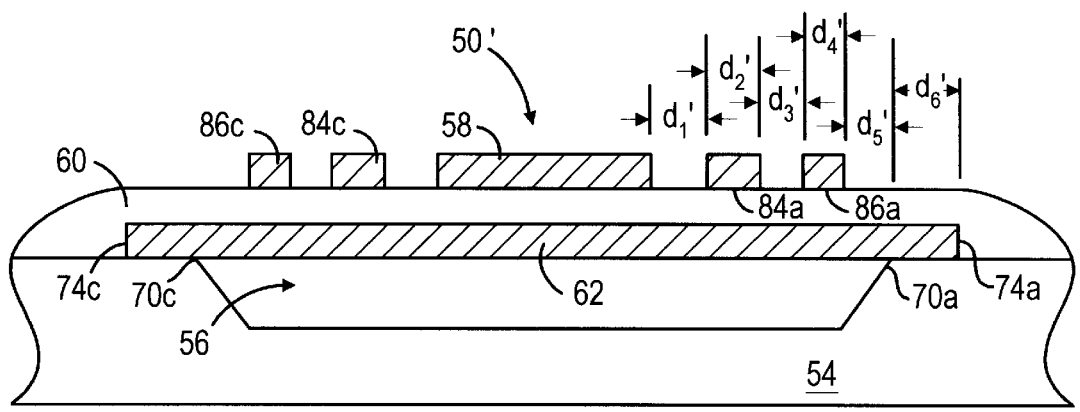
FIG. 7 is a cross-sectional view taken generally along the line 7—7 of FIG. 6.

FIGS. 6 and 7 illustrate another embodiment of an FBAR 50' with a perimeter reflection system in accordance with the present invention. FBAR 50' has a perimeter reflection system that includes a first and second multi-element reflectors. The first multi-element reflector has elements 84a, 84b and 84c, and the second multi-element reflector has elements 86a, 86b and 86c. Additional multi-element reflectors may be included, but are not illustrated for reasons of simplicity.

As best illustrated in FIG. 7, unlike structure 76 in FIGS. 3–5, which is not located above the depression 56 formed in the substrate 54, the first and second multi-element reflectors are located above the depression 56 to provide a more effective structure. Reflector elements 84a, 84b, 84c, 86a, 86b and 86c are higher acoustic impedance elements. Each of reflector elements 84a, 84b and 84c is located a distance $d_1'$ away from a corresponding edge of top electrode 58 and has a width $d_2'$. Similarly, each of reflector elements 86a, 86b and 86c is located a distance $d_3'$ away from respective reflector elements 84a, 84b and 84c and has a width $d_4'$. Reflector elements 86a, 86b and 86c are located a distance $d_5'$ from the respective edges 70a, 70b and 70c of the depression 56 formed in the substrate 54, and edges 70a, 70b and 70c of the depression 56 are located a distance $d_6'$ from respective edges 74a, 74b and 74c of the bottom electrode 62. The distances $d_1'$, $d_3'$, $d_5'$ and $d_6'$ and widths $d_2'$ and $d_4'$ are precisely chosen such that each is approximately equal to a quarter-wavelength of a sound wave travelling laterally across the particular region, in order to reflect lateral modes back to the FBAR 50' in phase.

Additional multi-element reflectors or structures similar structure 76 of FIGS. 3–5 may be provided outside of the depression 56 around the first and second multi-element reflectors. The FBAR 50' with multi-element reflectors may be made in a manner similar to that described above with respect to the FBAR 50 of FIGS. 3–5.

As described above, the present invention provides improved FBARs that result in less energy from lateral mode resonances. The perimeter reflection system of the FBAR and surrounding structure forms a series of Bragg reflectors that redirect energy from lateral mode resonances back to the acoustic cavity of the FBAR, where that energy may be converted to the desired longitudinal mode. The present invention provides an improved FBAR with a high Q that will permit the design of sharper frequency response filters, duplexers and oscillators with lower phase noise.

While particular embodiments of the present invention have been shown and described, it will be obvious to those of ordinary skill in the art that changes and modifications may be made without departing from this invention in its broader aspects. For example, even though the acoustic cavity of the FBARs shown has a rectangular shape, the acoustic cavity may take on any polygonal shape. In particular, it may be beneficial for the acoustic cavity to have an irregular polygonal shape (e.g., and irregular quadrilateral) in order to reduce the absorption anomalies caused by the lateral modes. The perimeter reflection system of the present invention may be designed for an FBAR with a non-rectangular acoustic cavity. Thus, the appended claims are to encompass within their scope all such changes and modifications as fall within the true spirit and scope of this invention.

What is claimed is:

1. An acoustic resonator comprising:
    a substrate having a depression formed in a top surface thereof;
    a first electrode disposed on the top surface of the substrate and over the depression, the first electrode extending beyond a plurality of edges of the depression by a first distance to define a first region therebetween;
    a piezoelectric material disposed on the top surface of the substrate and over the first electrode; and
    a second electrode disposed on the piezoelectric material and including a portion located above the depression, the portion located above the depression having at least one edge that is offset from a corresponding edge of the depression by a second distance to define a second region therebetween, the second region having an impedance that differs from an impedance of the first region,
    wherein an overlap of the first electrode, the piezoelectric material and the second electrode forms an acoustic cavity of the resonator, and the first and second distances are chosen such that reflections from the edges of the first and second regions will constructively interfere.

2. The acoustic resonator of claim 1, wherein each of the first and second regions has a width that is approximately equal to a quarter-wavelength of a sound wave travelling laterally across the respective region.

3. The acoustic resonator of claim 2, wherein the width of the first region is less than the width of the second region.

4. The acoustic resonator of claim 1, further comprising a structure disposed on the piezoelectric material, the structure being located a predetermined distance from an edge of the first electrode corresponding to the at least one edge of the second electrode that is offset from the corresponding edge of the depression, wherein a third region extends from that edge of the first electrode to the structure, the third region having an impedance that differs from the impedance of the first region, the predetermined distance being approximately equal to a quarter-wavelength of a sound wave travelling laterally across the third region.

5. The acoustic resonator of claim 4, wherein a fourth region is defined by the structure, the fourth region having an impedance that differs from the impedance of the third region, the fourth region having a width approximately equal to a quarter-wavelength of a sound wave travelling laterally across the fourth region.

6. The acoustic resonator of claim 4, wherein the structure includes a plurality of segments, each segment being spaced apart from a corresponding edge of the first electrode by the predetermined distance.

7. The acoustic resonator of claim 6, wherein the plurality of segments are connected to each other, the structure extending around a plurality of edges of the first electrode.

8. The acoustic resonator of claim 1, further comprising at least one structure disposed on the piezoelectric material above the depression, the at least one structure being located a predetermined distance from the at least one edge of the second electrode that is offset from the corresponding edge of the depression, wherein a third region extends from that edge of the second electrode to the structure, the predetermined distance being approximately equal to a quarter-wavelength of a sound wave travelling laterally across the third region, and wherein a fourth region is defined by the structure, the fourth region having an impedance that differs from the impedance of the third region, the fourth region having a width approximately equal to a quarter-wavelength of a sound wave travelling laterally across the fourth region.

9. The acoustic resonator of claim 8, wherein two structures are disposed in parallel on the piezoelectric material above the depression, the second structure being located a second predetermined distance from the first structure, the second predetermined distance being approximately equal to a quarter-wavelength of a sound wave travelling laterally across a fifth region between the first and second structures, and wherein a sixth region is defined by the second structure, the sixth region having a width approximately equal to a quarter-wavelength of a sound wave travelling laterally across the sixth region.

10. An acoustic resonator comprising:
   a substrate having a depression formed in a top surface thereof, the depression having a plurality of edges;
   a first electrode disposed on the top surface of the substrate and over the depression, the first electrode having a plurality of edges and extending beyond the edges of the depression by a first distance to define a first region therebetween;
   a piezoelectric material formed on the top surface of the substrate and the first electrode; and
   a second electrode disposed on the piezoelectric material, the second electrode including a portion located above the depression, a plurality of edges of the portion located above the depression being offset from corresponding edges of the depression by a second distance to define a second region therebetween, the second region having a second impedance that differs from a first impedance of the first region,
   wherein an overlap of the first electrode, the piezoelectric material and the second electrode forms an acoustic cavity of the resonator, and wherein the first and second regions form Bragg reflectors that reflect sound waves back to the acoustic cavity of the resonator.

11. The acoustic resonator of claim 10, wherein each of the first and second distances is approximately equal to a quarter-wavelength of a sound wave travelling laterally across the respective region.

12. The acoustic resonator of claim 10, wherein the second distance is greater than the first distance.

13. The acoustic resonator of claim 10, wherein the first distance is approximately 2 microns.

14. The acoustic resonator of claim 10, further comprising a structure disposed on the piezoelectric material, the structure being located a predetermined distance from an edge of the first electrode, wherein a third region extends from that edge of the first electrode to the structure, and a fourth region is defined by the structure, the third region having a third impedance that differs from both the first impedance and a fourth impedance of the fourth region.

15. The acoustic resonator of claim 14, wherein the structure includes a plurality of sections, each section being located from a corresponding edge of the first electrode by the first distance.

16. The acoustic resonator of claim 14, wherein each of the predetermined distance and a width of the fourth region is approximately equal to a quarter-wavelength of a sound wave travelling laterally across the respective region.

17. A method of making an acoustic resonator, the method comprising:
   providing a substrate having a depression formed in a top surface thereof and a first electrode disposed on the top surface, the first electrode being located above the depression and extending beyond a plurality of edges of the depression by a first distance to define a first region therebetween;
   depositing a piezoelectric material on the top surface of the substrate and over the first electrode; and
   depositing a second electrode on the piezoelectric material, the second electrode including a portion located above the depression, the portion located above the depression having at least one edge that is offset from a corresponding edge of the depression by a second distance to define a second region therebetween,
   wherein an overlap of the first electrode, the piezoelectric material and the second electrode forms an acoustic cavity of the resonator, and the first and second distances are chosen such that reflections from the edges of the first and second regions will constructively interfere.

18. The method of claim 17, wherein the first region has a first impedance that differs from a second impedance of the second region, each of the first and second distances being approximately equal to a quarter-wavelength of a sound wave travelling laterally across the respective region to maximize a reflection coefficient for lateral modes bouncing off of edges of the acoustic cavity.

19. The method of claim 18, further comprising forming a structure on the piezoelectric material, the structure being located a predetermined distance from at least one edge of the first electrode, wherein a third region extends from the at least one edge of the first electrode to the structure, the predetermined distance being approximately equal to a quarter-wavelength of a sound wave travelling laterally across the third region, and wherein a fourth region is defined by the structure and has a width approximately equal to a width of a quarter-wavelength of a sound wave travelling laterally across the fourth region, the third region having a third impedance that differs from both the first impedance and a fourth impedance of the fourth region.

20. The method of claim 17, further comprising forming at least one structure on the piezoelectric material above the depression, the at least one structure being located a predetermined distance from the at least one edge of the second electrode that is offset from the corresponding edge of the depression, wherein a third region extends from that edge of the second electrode to the structure, the predetermined distance being approximately equal to a quarter-wavelength of a sound wave travelling laterally across the third region, and wherein a fourth region is defined by the structure, the fourth region having a width approximately equal to a quarter-wavelength of a sound wave travelling laterally across the fourth region.

* * * * *